United States Patent [19]
Pascucci

[11] Patent Number: 5,270,590
[45] Date of Patent: Dec. 14, 1993

[54] SENSE CIRCUIT FOR STORAGE DEVICES SUCH A NON-VOLATILE MEMORIES, WITH ENHANCED SENSING DISCRIMINATION

[75] Inventor: Luigi Pascucci, Sesto San Giovanni, Italy

[73] Assignee: SGS-Thomson Microelectronics, s.r.l., Milan, Italy

[21] Appl. No.: 806,118

[22] Filed: Dec. 12, 1991

[30] Foreign Application Priority Data

Dec. 13, 1990 [EP] European Pat. Off. ......... 90830583.2

[51] Int. Cl.$^5$ .......................... H03F 3/45; H03K 5/22
[52] U.S. Cl. .................... 307/530; 307/350; 307/355; 307/491; 307/494; 365/210
[58] Field of Search ............... 307/530, 350, 355, 491, 307/494; 365/210

[56] References Cited

U.S. PATENT DOCUMENTS

| | | | |
|---|---|---|---|
| 4,974,207 | 11/1990 | Hashimoto | 365/210 |
| 5,091,888 | 2/1992 | Akaogi | 365/210 |
| 5,117,394 | 5/1992 | Amin et al. | 365/210 |
| 5,148,063 | 9/1992 | Hotta | 307/530 |

FOREIGN PATENT DOCUMENTS 0326004 8/1989 European Pat. Off. .

OTHER PUBLICATIONS

*IEEE Journal of Solid-State Circuits*, vol. 23, No. 5 published Oct., 1988, regarding article entitled "A 1-M-BIT CMOS EPROM With Enchanted Verification".

Primary Examiner—Margaret R. Wambach

[57] ABSTRACT

The sense circuit, for recognizing the virgin or programmed status of cells in storage devices, comprises a differential amplifier having a first input connected to a number of selectable matrix cells, through a first uncoupling circuit, a second input connected to a number of selectable reference virgin cells through a second uncoupling circuit, respective matrix and reference load transistors connected between each input of the amplifier and a supply voltage, and a current generator connected in parallel to the matrix cells and controlled by the first input of the amplifier to draw a current equal to a predetermined fraction of the current flowing through said first input.

16 Claims, 3 Drawing Sheets

SENSE CIRCUIT FOR STORAGE DEVICES SUCH A NON-VOLATILE MEMORIES, WITH ENHANCED SENSING DISCRIMINATION

TECHNICAL FIELD OF THE INVENTION

This invention is concerned with an improved sense circuit for recognizing the virgin or programmed status of the cells in storage devices such as CMOS non-volatile memories, having an enhanced discrimination between virgin and programmed cells of the storage device.

BACKGROUND OF THE INVENTION

In circuits made with CMOS technology, where programmable components are used to make non-volatile memories (ROM, EPROM, EEPROM, FLASH), it is necessary to provide a reference system which is able to recognize programmed elements (which are turned off) from non-programmed, or virgin, elements (which are turned on). Recognition is achieved by comparing the current $I_{vr}$ in a virgin reference cell with the current in the matrix element or cell which it is desired to read. The latter current will ideally be zero for a programmed cell ($I_{pm}$), non-zero for a virgin cell ($I_{vm}$). In order to have a balanced comparison, where the discrimination value lies at halfway between $I_{vm}$ and $I_{pm}$, it is known to shift the discrimination threshold by means either of differently sized loads on the matrix cell and on the reference cell (unbalanced loads), or of an auxiliary current $I_{vr}/2$ added to the current from the matrix cell under scrutiny (constant or variable offset current).

In either case, the difference of the reading from the threshold for a virgin cell and for a programmed cell never exceeds half the value of the current in the virgin cell ($I_{vm}/2$). Moreover, with the offset current technique, where autonomously implemented current mirrors are used for generating the offset current, the performance may decay further if the electrical characteristics of the transistors in the current mirror are not perfectly identical to the other components of the storage device.

Accordingly, the main object of the invention is to provide an improved sense circuit for recognizing the virgin or programmed status of the cells in storage devices such as non-volatile memories, which widens the effective difference of the matrix cell current from the threshold current both for the virgin and for the programmed cell, thus enhancing the discrimination capability of the sense circuit.

SUMMARY OF THE INVENTION

The invention achieves the above and other objects and advantages, such as will appear from the following disclosure, with an improved sense circuit for recognizing the virgin or programmed status of cells in storage devices such as non-volatile memories, of the type with unbalanced loads, characterized in that it comprises a differential amplifier having a first input connected to a number of selectable matrix cells through a first uncoupling circuit, a second input connected to a number of selectable reference virgin cells through a second uncoupling circuit, respective matrix and reference load transistors, connected between each input of the differential amplifier and a supply voltage, and a current generator connected in parallel to the matrix cells and controlled by the first input of the amplifier to draw a current equal to a predetermined fraction of the current flowing through said first input.

BRIEF DESCRIPTION OF THE DRAWINGS

The invention will now be described in more detail with reference to a preferred embodiment, given by way of illustrative and nonlimiting example, and with the aid of the attached drawings, wherein.

DETAILED DESCRIPTION

Figure 1:
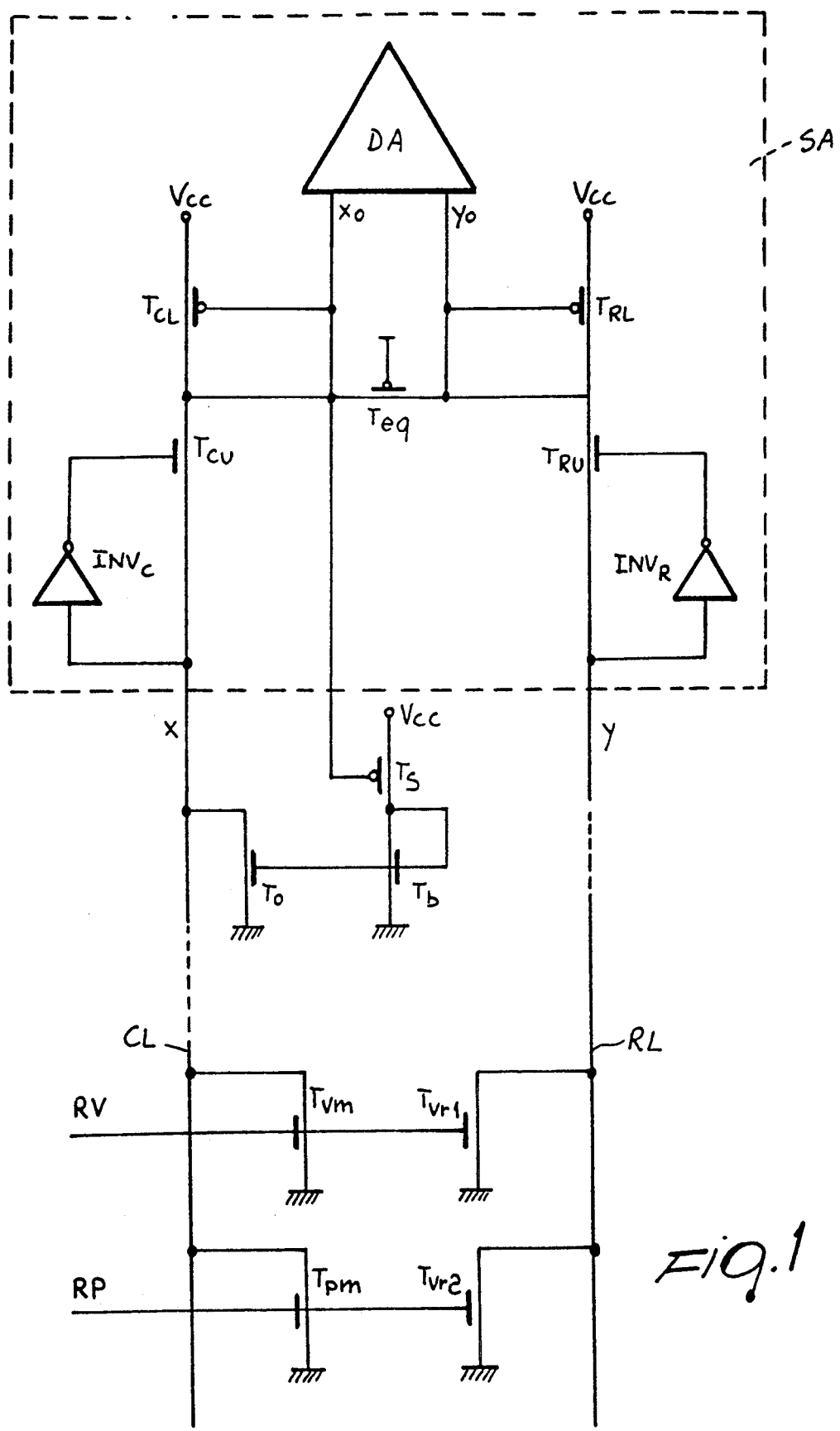
FIG. 1 is a diagram of a first preferred embodiment of a sense circuit according to the invention.

FIG. 1 shows a sense circuit for CMOS EPROMs according to the invention, with partly illustrated arrays of matrix cells and reference cells, all of which are N-channel. $T_{vm}$ and $T_{pm}$ are a virgin cell and a programmed cell, respectively, which are part of a matrix of cells or transistors (not shown fully) of an EPROM storage device made with CMOS technology. Each of the cells $T_{vm}$ and $T_{pm}$ has a grounded source, a gate connected to a row line RV or RP, respectively, and a drain connected to a column line CL terminating, via a select multiplexer not shown, into a first input X of a sensing amplifier SA further described below.

$T_{vr1}$ and $T_{vr2}$ are two virgin reference cells, corresponding to matrix cells $T_{vm}$ and $T_{pm}$, respectively, and each of the reference cells has a grounded source, a gate connected to the row line RV or RP of the corresponding matrix cell, and a drain connected to a reference line RL terminating into a second input Y of the sensing amplifier SA.

Sensing amplifier SA comprises a basic differential amplifier DA, of any conventional design, having a first input $X_o$ and a second input $Y_o$, and two P-channel load transistors $T_{CL}$ and $T_{RL}$, having their drains tied to a supply voltage $V_{cc}$ and their gates driven by the respective inputs $X_o$ and $Y_o$ of differential amplifier DA. According to the invention, sensing amplifier SA further comprises respective uncoupling circuits, each comprising a series N-channel transistor ($T_{cu}$ or $T_{ru}$), and an inverter ($INV_C$ or $INV_R$), which drive their respective sources and are driven by inputs X and Y, respectively, of the sensing amplifier. These uncoupling circuits also act as preamplifiers for the input signals.

The sources of $T_{CL}$ and of $T_{RL}$ are connected to inputs $X_o$ and $Y_o$ of differential amplifier DA, and, moreover, they are tied to each other through an equalizing P-channel transistor $T_{eq}$, which is turned on to momentarily short-circuit inputs $X_o$ and $Y_o$ and loads $T_{CL}$ and $T_{RL}$ during a time slice preceding evaluation, as known in the art.

Each of the row lines can be selectively driven high by means not shown, as well known in the art, to select the matrix cell at the crosspoint of the selected column and row. If the selected cell is virgin, such as $T_{vm}$, a current $I_{vm}$ is caused to flow through it, while, if the selected cell is programmed, such as $T_{pm}$, an ideally null current $I_{pm}$ will be caused to flow through it. When a matrix cell is selected, the reference cell $T_{vr1}$ or $T_{vr2}$ tied to its row line will also be selected, and a current $I_{vr}$ will be caused to flow through it.

A current mirror is associated to the selected column line, comprising a P-channel transistor $T_s$ having its drain tied to supply voltage $V_{cc}$, its source connected to ground through a diode-connected, N-channel transistor $T_b$, and its gate connected to input $X_o$ of differential amplifier DA, to be driven by the voltage level existing on such input, so that a current equal to ¼ of the current $I_{CL}$ through load transistor $T_{CL}$ is forced through $T_b$. The voltage developed across $T_b$ drives the gate of a further N-channel transistor $T_o$, which is connected between column line CL and ground. The net effect is to create an offset current $I_{CL}/4$ in parallel to the selected matrix cell $T_{vm}$ or $T_{pm}$.

With the circuit arrangement described above, a mode of offset current operation is obtained where the offset, rather than being constant, depends on the biasing on the matrix cell and the reference cell being selected. More particularly, as described below, the offset current will be larger if the selected matrix cell is virgin, smaller if the matrix cell is programmed. The difference between the discrimination threshold and the current reading for any given matrix cell is thereby increased above the theoretical limit in conventional sense circuits, either with offset current or with unbalanced loads, and the discrimination performance and tolerance to parameter variation is enhanced.

The operation of the circuit of FIG. 1 will now be described. As known to the person skilled in the art, $T_{eq}$ is on while the row and line select operation is taking place, and therefore loads $T_{CL}$ and $T_{RL}$ are shorted to each other during the propagation time, and equal currents flow in both loads. In this condition, when a virgin matrix cell $T_{vm}$ is selected, the following relationship holds:

$$I_{ov} = (I_{vr} + I_{vm} + I_{ov})/4 \qquad (1)$$

where $I_{vr}$, $I_{vm}$, $I_{pm}$ have the meanings defined above, and $I_{ov}$ is the offset current when a virgin cell is selected.

When a programmed matrix cell is selected, the following equality holds:

$$I_{op} = (I_{pr} + I_{pm} + I_{op})/4 \qquad (2)$$

where $I_{op}$ is the offset current when a programmed cell is selected.

In the ideal case, $I_{vr} = I_{vm} = I_v$, and $I_{pm} = 0$. Eqs. (1) and (2) then reduce to:

$$I_{ov} = (2I_v + I_{ov})/4 \qquad (3)$$

$$I_{op} = (I_v + I_{op})/4, \qquad (4)$$

or $$I_{ov} = (\tfrac{2}{3})I_v$$

$$I_{op} = (\tfrac{1}{3})I_v$$

The following inequalities follow:

$$I_v < (5/3)I_v \text{ for a virgin cell, and} \qquad (5)$$

$$I_v > (\tfrac{1}{3})I_v \text{ for a programmed cell.} \qquad (6)$$

In other words, a virgin cell will still be correctly evaluated, even if, due to parameter variations or to extreme values of the supply voltage, the current sensed should be somewhat larger than $(3/2) I_v$ (the governing relationship for a conventional offset current sense circuit). Moreover, the offset current ($I_{ov}$ or $I_{op}$) is obtained from the matrix elements themselves, not from a different (though similar) device: therefore, the accuracy of the current is improved.

Figure 3:
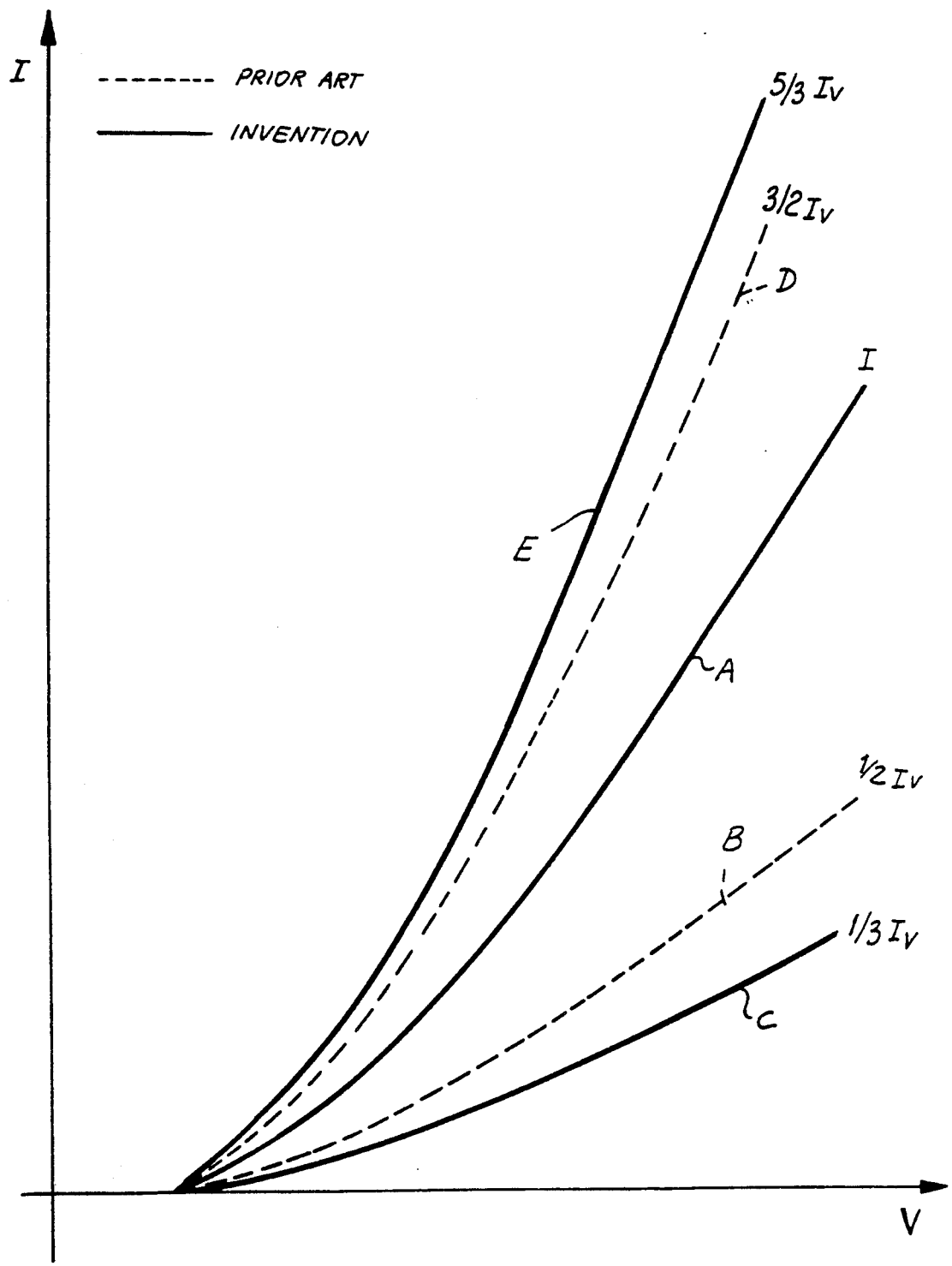
FIG. 3 is an illustrative current-voltage plot showing various current quantities plotted against an increasing supply voltage for a sense circuit according to FIG. 1 or 2.

The above situation can be better understood from the diagram of FIG. 3, where the lines show how the values of several current quantities of interest change as the supply voltage $V_{cc}$ varies from 0 V upwards. Line A shows the current $I_v$ (in a virgin cell; dashed line B shows the current $I_v/2$ which is the discrimination limit for a programmed cell in a conventional circuit; line C is the same limit (current $(\tfrac{1}{3})I_v$) for the circuit of FIG. 1. Similarly, dashed line D shows the current $(3/2)I_v$ which is the discrimination limit for a virgin cell in a conventional circuit; and line E is the same limit (current $(5/3)I_v$) for the circuit of FIG. 1.

The ratio ¼ of the offset current to the load current, or "mirror ratio", may be changed to other values, with a corresponding change in the constants of Eqs. (5) and (6). With a mirror ratio of, say, ½, Eqs. (5) and (6) become:

$$I_v < 2I_v \text{ for a virgin cell, and}$$

$$I_v > (\tfrac{1}{2})I_v \text{ for a programmed cell.}$$

With a mirror ratio 1/5:

$$I_v < (5/4)I_v \text{ for a virgin cell, and}$$

$$I_v > (\tfrac{1}{4}) I_v \text{ for a programmed cell.}$$

The above relationships (i.e. (3) and ff.) hold for $I_{pm} = 0$. If, as would be the case in the real world, this is not true, then Eq. (6) should read:

$$I_v > (\tfrac{1}{3})I_v + I_{pm},$$

or $$(\tfrac{2}{3})I_v > I_{pm},$$

i.e., the current in a programmed cell should not exceed ⅔ of the current in a virgin cell for the sensing to be correct. This, again, is an improvement over the performance of a conventional circuit in the same circumstances.

It should be noted that all the above equations refer to the initial condition of the sense circuit, i.e. before the offset currents have been modified by the operation of the sense circuit. As soon as $T_{eq}$ has been turned off (i.e. during evaluation), the mirrored current $I_{ov}$ or $I_{op}$ will be increased if a virgin cell has been selected, and decreased if a programmed cell has been selected.

Figure 2:
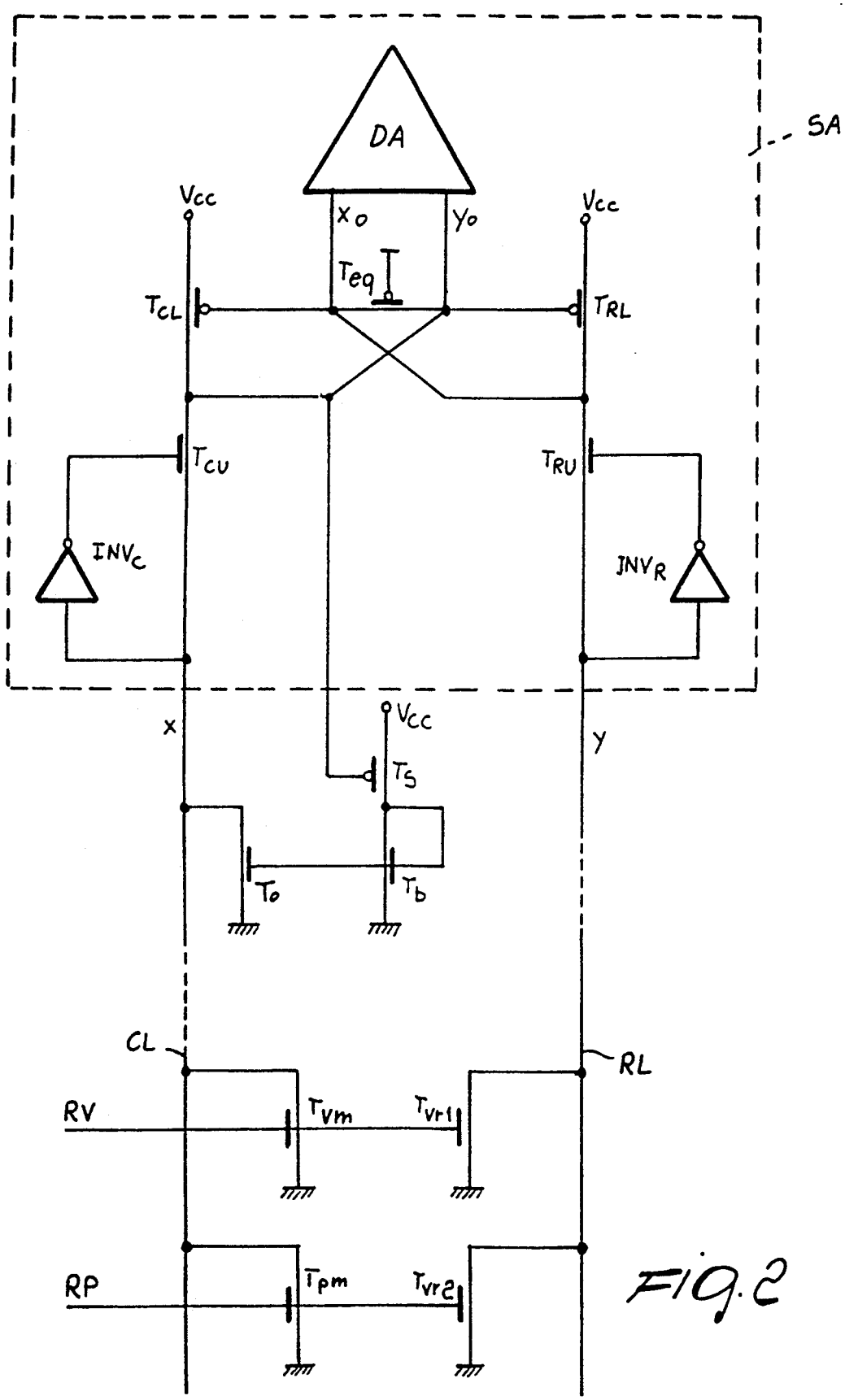
FIG. 2 is a diagram of a second preferred embodiment of a sense circuit according to the invention.

FIG. 2 shows an alternative embodiment of the invention, similar to the first embodiment, except that the load transistors, rather than being diode-connected, are cross-connected. The operation of this embodiment is substantially the same as described above, but the cross-connection is a positive feedback that enhances the dynamic range of the signals, both at inputs X and Y, and at inputs $X_o$ and $Y_o$.

Two preferred embodiments of the invention have been disclosed above, but it is understood that changes may be made to it by one skilled in the art. In particular, although the expression "programmed" used above suggests that programmation has been achieved by application of electrical biases, it should in fact be understood also to cover programmation achieved by means of masks during the manufacturing process, e.g. in the production of ROMS.

I claim:

1. An improved sense circuit for recognizing the virgin or programmed status of cells in storage devices such as non-volatile memories, of the type with unbalanced loads, comprising:
a differential amplifier having
a first input connected to a number of selectable matrix cells through a first uncoupling circuit,
a second input connected to a number of selectable reference virgin cells through a second uncoupling circuit
respective matrix and reference load transistors connected between each input of the amplifier and a supply voltage, and
a current generator connected in parallel to the matrix cells and controlled by the first input of the amplifier to draw a current equal to a predetermined fraction of a current flowing through said first input.

2. The sense circuit of claim 1, wherein said current is drawn from the current generator of a magnitude from $\frac{1}{3}$ to 1/5 of the current flowing through said first input.

3. The sense circuit of claim 2, wherein said current drawn from the current generator of a magnitude is $\frac{1}{4}$ of the current flowing through said first input.

4. The sense circuit of claim 1 or 2, wherein said current generator is a current mirror driven by a control transistor controlled by the same voltage controlling a gate of one of the load transistors, the size of said control transistor being in a desired ratio to that of one of said load transistor.

5. The sense circuit of claim 1 or 2, wherein said uncoupling circuits each comprise a series transistor controlled by an output of a respective inverter having its input connected to the matrix cells.

6. The sense circuit of claim 1, 2, or 3, wherein the first and second inputs of the differential amplifier are connected through an equalizing transistor which is turned on to momentarily short-circuit inputs during a time slice preceding evaluation.

7. The sense circuit according to claim 1, wherein said selectable matrix cells include a programmed cell and a virgin cell, and wherein an offset current generated by said current generator when said programmed cell is selected is lower that an offset current generated when said selectable matrix virgin cell is selected.

8. The sense circuit of claim 1, wherein said selectable matrix cells include a programmed cell, and wherein an variable offset current is substantially equal to $\frac{1}{3}$ of a current flowing through said reference virgin cells when said programmed cell is selected.

9. The sense circuit of claim 1, wherein said selectable matrix cells include a virgin cell, and wherein an offset current is substantially equal to $\frac{2}{3}$ of a current flowing through said reference virgin cells when said selectable matrix virgin cell is selected.

10. An integrated circuit memory, comprising:
a memory array comprising a plurality of array bitlines, and a plurality of memory cells selectably connected to each said array bitline;
at least one reference bitline, and a plurality of reference cells selectably connected to said reference bitline;
at least two respective bitline loads, connected to at least one said reference bitline and at least one said array bitline respectively;
a differential amplifier having input terminals operatively connected to at least one said reference bitline and at least one said array bitline;
a current mirror circuit, configured and connected to produce a mirrored current which is proportional to and less than a current passed by at least one of said loads;
wherein said mirrored current is connected to at least one said input terminal of said differential amplifier.

11. The sense circuit of claim 10, wherein said memory cells are EPROM cells.

12. The sense circuit of claim 10, wherein said reference cells are all virgin.

13. The sense circuit of claim 10, wherein each said bitline load consists of a PMOS transistor.

14. The sense circuit of claim 10, wherein said mirrored current is proportional to, and is combined with, the current passed by said one of said loads.

15. The sense circuit of claim 10, wherein said mirrored current is mirrored from one of said loads, and is combined with current passed by another of said loads.

16. A method for sensing an integrated circuit memory whose cells provide a current output, comprising the steps of:
activating a selected wordline, to select at least one row of memory cells in an array;
loading at least one reference bitline having a plurality of reference cells selectably connected thereto, and at least one said array bitline having a plurality of memory cells selectably connected thereto, to produce a voltage differential therebetween;
mirroring a current passed by at least one load circuit, to produce a mirrored current which is proportional to and less than the current passed by said at least one load circuit, and summing said mirrored current into at least one said array bitline, and
sensing the voltage differential between said at least one reference bitline and said at least one array bitline.

* * * * *